(12) United States Patent
Lebby et al.

(10) Patent No.: US 8,637,763 B2
(45) Date of Patent: Jan. 28, 2014

(54) SOLAR CELLS WITH ENGINEERED SPECTRAL CONVERSION

(75) Inventors: Michael Lebby, Apache Junction, AZ (US); Andrew Clark, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 339 days.

(21) Appl. No.: 12/788,285

(22) Filed: May 26, 2010

(65) Prior Publication Data
US 2011/0290313 A1 Dec. 1, 2011

(51) Int. Cl.
*H01L 31/00* (2006.01)
*C01B 33/02* (2006.01)

(52) U.S. Cl.
USPC .......................... 136/256; 136/247

(58) Field of Classification Search
USPC .......................... 136/252, 256, 247
See application file for complete search history.

(56) References Cited

U.S. PATENT DOCUMENTS

| | | | | |
|---|---|---|---|---|
| 6,689,950 | B2* | 2/2004 | Cordaro | 136/250 |
| 2005/0161694 | A1* | 7/2005 | Reeh et al. | 257/100 |
| 2006/0060826 | A1* | 3/2006 | Atanackovic | 252/500 |
| 2006/0076048 | A1* | 4/2006 | Gaudiana et al. | 136/246 |
| 2006/0219294 | A1* | 10/2006 | Yabuuchi et al. | 136/263 |
| 2007/0251570 | A1* | 11/2007 | Eckert et al. | 136/256 |
| 2008/0078444 | A1* | 4/2008 | Atanackovic | 136/256 |
| 2008/0213663 | A1* | 9/2008 | Hu et al. | 429/219 |
| 2008/0264487 | A1* | 10/2008 | Takahashi et al. | 136/263 |
| 2008/0295879 | A1* | 12/2008 | Atanackovic | 136/238 |
| 2009/0217968 | A1* | 9/2009 | Joshi et al. | 136/250 |
| 2010/0084000 | A1* | 4/2010 | Ueda | 136/244 |
| 2010/0116315 | A1* | 5/2010 | Clark et al. | 136/244 |
| 2010/0126566 | A1* | 5/2010 | Ji | 136/252 |
| 2010/0193011 | A1* | 8/2010 | Mapel et al. | 136/246 |
| 2010/0206382 | A1* | 8/2010 | Takahashi et al. | 136/263 |
| 2010/0313940 | A1* | 12/2010 | Wehrspohn et al. | 136/254 |
| 2011/0041895 | A1* | 2/2011 | Carroll | 136/250 |
| 2011/0114174 | A1* | 5/2011 | Rennig et al. | 136/257 |
| 2011/0232752 | A1* | 9/2011 | Mataki et al. | 136/257 |
| 2011/0315219 | A1* | 12/2011 | Hasan et al. | 136/257 |

OTHER PUBLICATIONS

Aghamalyn et al, Photoluminescence of Erbium in Polycrystalline Ceramics and in Crystalline Film of Erbium Oxide, Mar. 2009, Journal of Contemporary Phsyics (Armenian Academy of Sciences) vol. 44 No. 6 pp. 291-295.*
Polman et al, Broadband sensitizers for erbium doped planar optical amplifiers: review, May 2004, Journal of Optical Society of America, vol. 21, No. 5 pp. 871-892.*
Strumpel et al, Modifying the solar spectrum to enhance silicon solar cell efficiency—An overview of available materials, 2006 , ScienceDirect, pp. 238-250.*
Sobolev et al, Photoluminescence in Er implanted AlGaN GaN superlattices and GaN epilayers, 2003, Elsevier, pp. 1-5.*

* cited by examiner

*Primary Examiner* — Jonathan Johnson
*Assistant Examiner* — Bethany Lambright
(74) *Attorney, Agent, or Firm* — Parsons & Goltry; Robert A. Parsons; Michael W. Goltry

(57) ABSTRACT

A solar cell with engineered spectral conversion elements or components includes a single crystal silicon solar cell having a back surface. At least one spectral conversion element is formed on the back surface. The conversion element includes single crystal rare earth oxide, and the single crystal rare earth oxide is crystal lattice matched to the back surface of the silicon solar cell. Material including silicon is formed on the back surface in a surrounding and embedding relationship to the at least one spectral conversion element. A back reflector is positioned on the material formed on the back surface so as to reflect light passing through the silicon formed on the back surface.

15 Claims, 13 Drawing Sheets

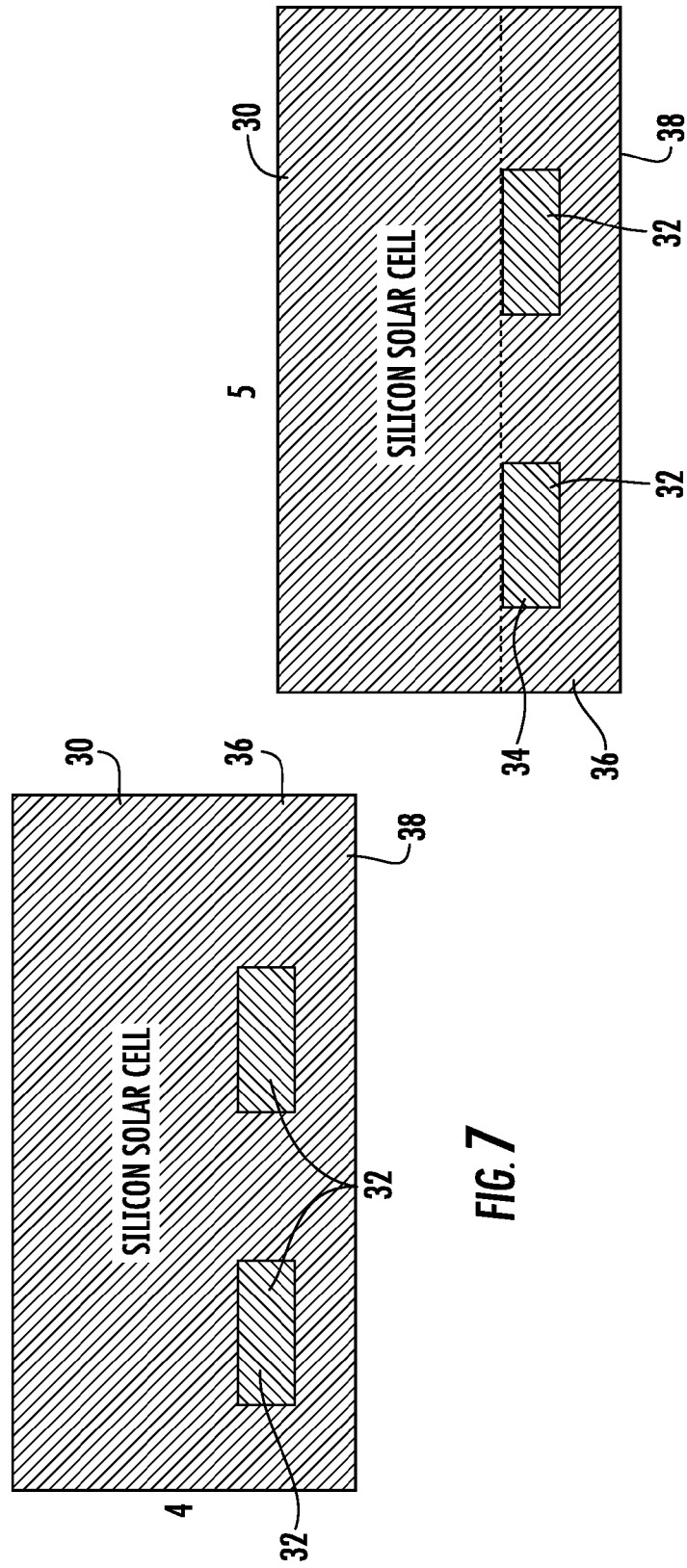

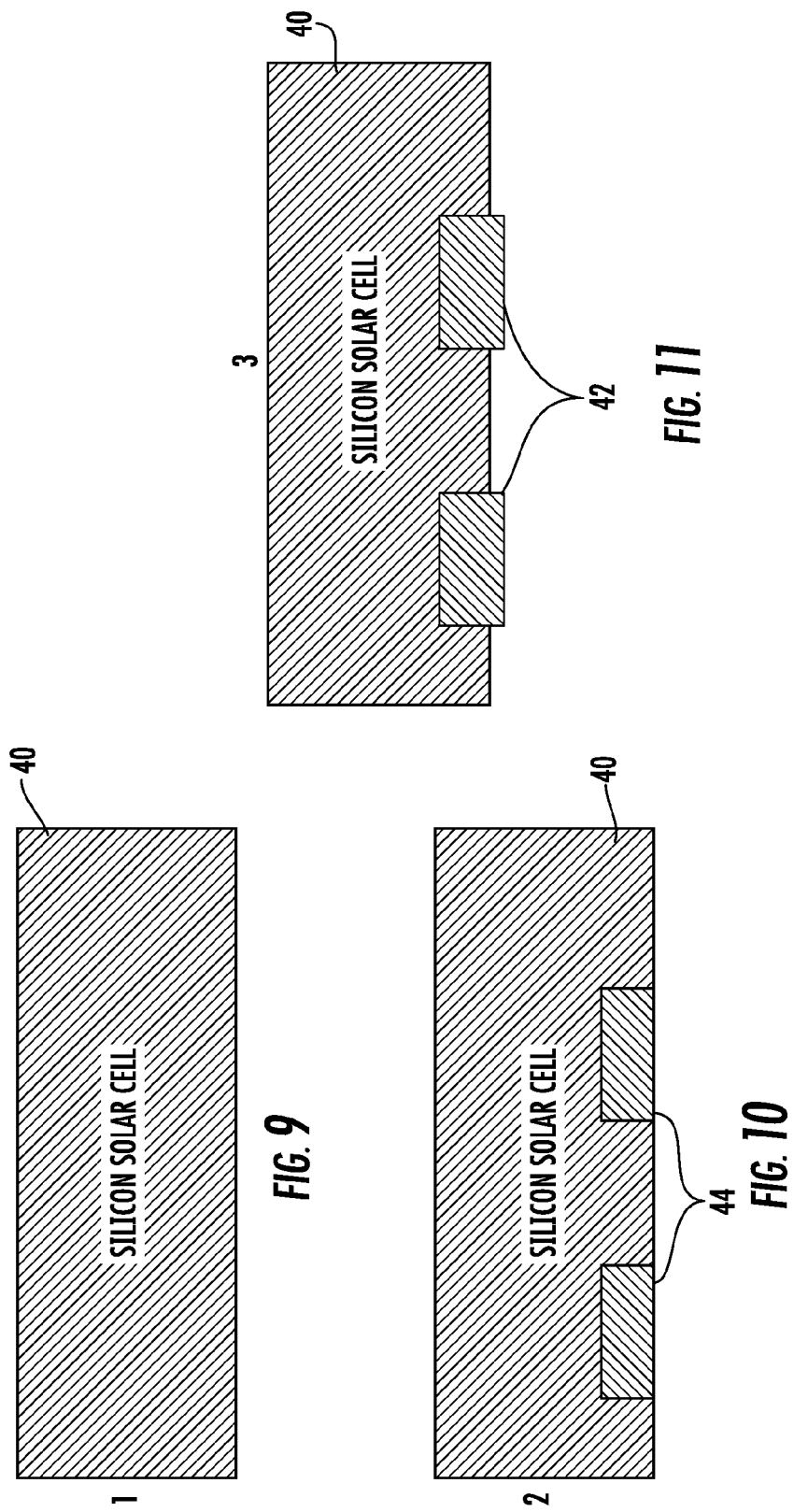

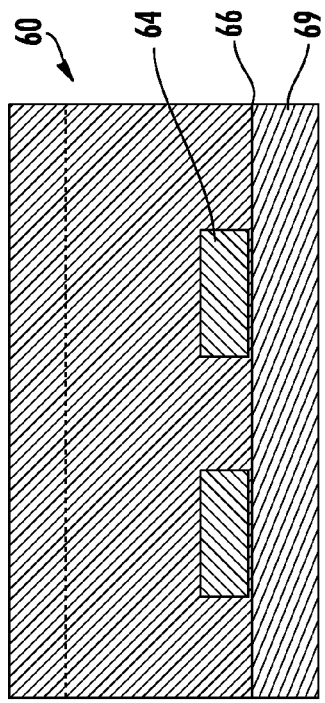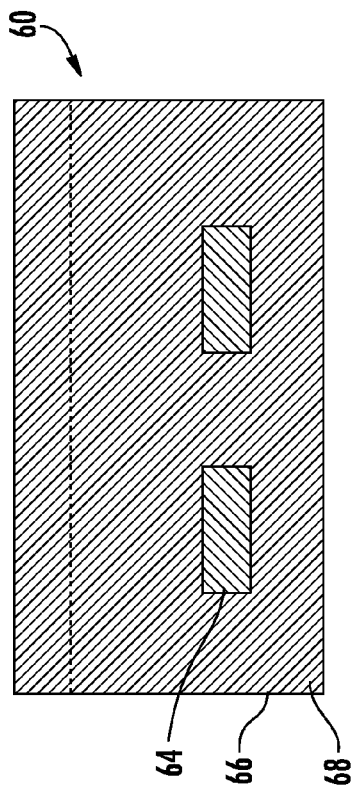

SOLAR CELLS WITH ENGINEERED SPECTRAL CONVERSION

FIELD OF THE INVENTION

This invention relates to solar cells and fabrication methods and more particularly, to solar cells including spectral conversion components.

BACKGROUND OF THE INVENTION

At the present time, solar cells are primarily silicon devices because of the maturity of the silicon processing art and the fact that silicon is one of the least expensive and most abundant materials available. Further, silicon based solar cells can be easily and inexpensively integrated into silicon circuits for collection and other functions. However, it is well known in the solar cell art that most silicon solar cells are able to convert only a small portion of solar energy into electricity. This is primarily due to the fact that the spectral range of Si photodiodes is confined to a wavelength range of between 200 nm and approximately 1100 nm.

In attempts too overcome the conversion drawbacks of silicon solar cells, some spectral conversion materials have been developed that absorb solar energy and reemit it in a different spectral range. Most of these spectral conversion materials provide "up-conversion" phenomena, which is the absorption of lower spectral range energy (or higher wavelength of light) and the reemission at a higher spectral range of energy (or a lower wavelength of light). Thus, up-conversion materials absorb spectral energy above 1100 nm (generally around 1500 nm) and reemit it at, for example, 980 nm. In current spectral conversion solutions, all of the up-conversion material is placed in proximity to the back surface of the solar cell. The use of a back reflector allows for the double pass of light (spectral energy) through the up-conversion layer.

One problem that occurs with this positioning of the up-conversion material is that because of the difference of the index of refraction between the silicon and the up-conversion material, the light reflected from the back reflector must impinge on the interface within a 60° angle of incidence. If the angle of incidence is less than 60° the light is simply reflected back into the up-conversion material and lost. Since the up-conversion material is assumed to emit light in a lambertian profile (i.e. in all directions), only ⅙ of the reemitted light is useable.

It would be highly advantageous, therefore, to remedy the foregoing and other deficiencies inherent in the prior art.

An object of the present invention is to provide a new and improved solar cell with engineered spectral conversion.

Another object of the present invention is to provide a solar cell with engineered spectral conversion that is more efficient at converting solar energy.

Another object of the present invention is to provide a solar cell with engineered spectral conversion that is relatively easy to fabricate.

Another object of the present invention is to provide a new and improved method of fabricating solar cells with engineered spectral conversion.

SUMMARY OF THE INVENTION

Briefly, to achieve the desired objects and aspects of the instant invention in accordance with a preferred embodiment thereof provided is a solar cell with engineered spectral conversion elements or components. The solar cell is formed of semiconductor material and at least one spectral conversion element is formed on the back surface. Semiconductor material is formed on the back surface in a surrounding and embedding relationship with the at least one spectral conversion element.

The desired objects and aspects of the instant invention are further achieved in accordance with a preferred method of fabricating a solar cell with engineered spectral conversion elements or components. The method includes the steps of providing a single crystal silicon solar cell and depositing at least one spectral conversion element on the back surface. The conversion element includes single crystal rare earth oxide, and the single crystal rare earth oxide is crystal lattice matched to the back surface of the silicon solar cell. The method further includes the steps of depositing material including silicon on the back surface and surrounding and embedding the at least one spectral conversion element with the material and positioning a back reflector on the material formed on the back surface so as to reflect light passing through the material formed on the back surface.

BRIEF DESCRIPTION OF THE DRAWINGS

Specific objects and advantages of the instant invention will become readily apparent to those skilled in the art from the following detailed description of a preferred embodiment thereof taken in conjunction with the drawings, in which:

FIGS. 4-8 illustrate steps in a process of embedding a rare earth up-conversion material in a solar cell in accordance with the present invention;

FIGS. 9-12 illustrate steps in another process of embedding a rare earth up-conversion material in a solar cell in accordance with the present invention;

FIGS. 15 through 18 illustrate steps in a process of embedding a rare earth up-conversion material in the p-type based solar cell of FIG. 13;

DETAILED DESCRIPTION OF THE DRAWINGS

Figure 2:
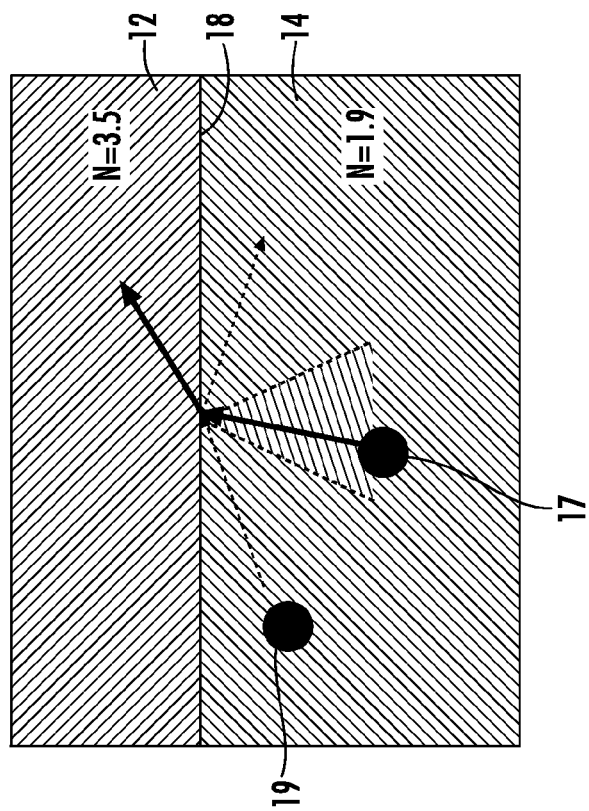
FIG. 2 is a reflection diagram for a silicon/rare earth up-conversion material interface.
Figure 1:
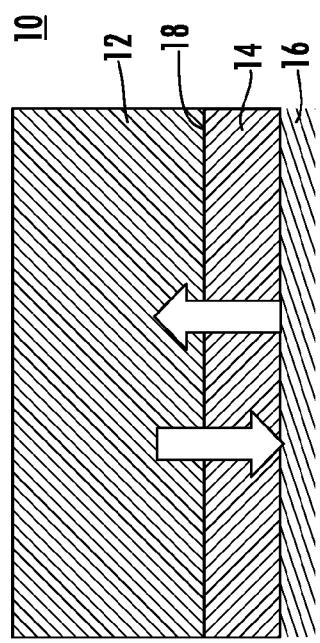
FIG. 1 is a simplified side view of a double pass solar cell.

Turning now to the drawings, attention is first directed to FIG. 1, which illustrates a simplified side view of a standard double pass solar cell 10. Solar cell 10 includes a silicon solar cell 12 with a layer 14 of up-conversion material and a reflective back 16. As illustrated in more detail in FIG. 2, the silicon solar cell has an index of refraction of approximately 3.5 while the index of refraction for a typical rare earth up-conversion material is approximately 1.9. Thus, the interface, designated 18, reflects any light impinging thereon at an angle of less than approximately 60° back into up-conversion material 14. A photon 17, for example, that strikes interface 18 within the 60° cone passes into silicon solar cell 12 and is converted to electrical energy. A photon 19, for example, that strikes interface 18 at an angle less than 60° is reflected back into up-conversion material 14 and is lost.

Figure 3:
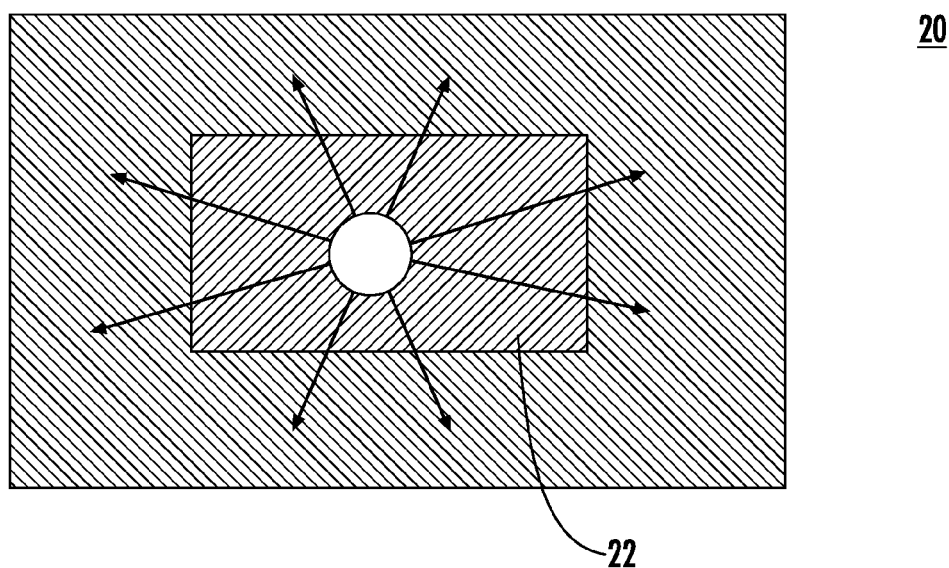
FIG. 3 is a simplified view of a silicon solar cell including rare earth up-conversion material in accordance with the present invention.
Figure 4:
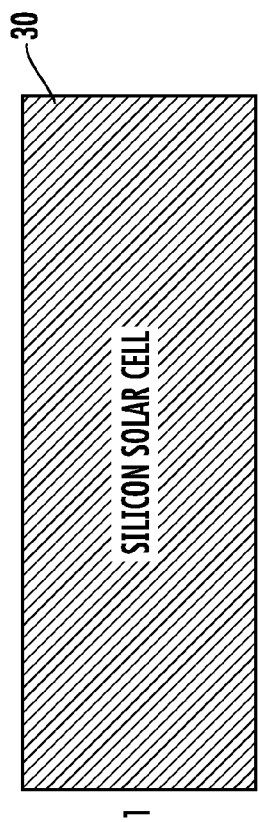
Figure 5:
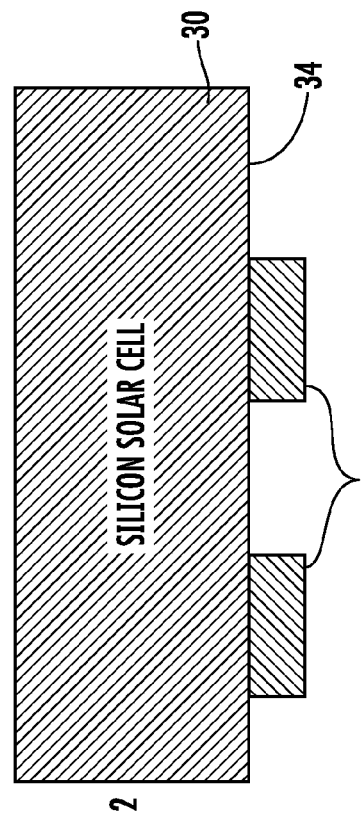
Figure 6:
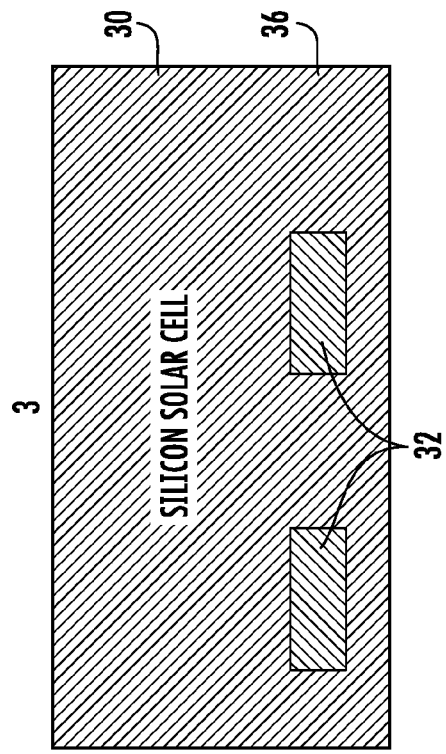
Figure 12:
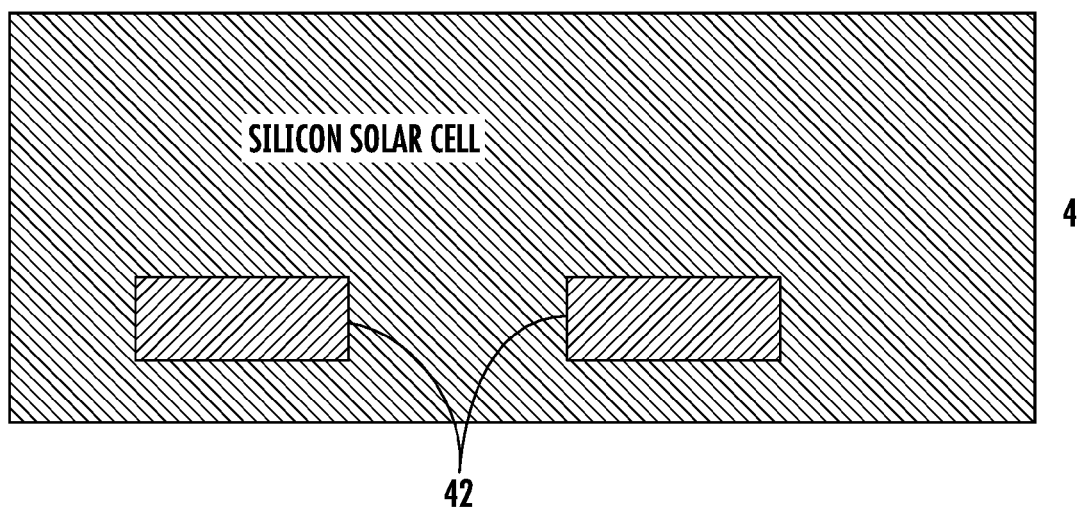

Referring additionally to FIG. 3, a simplified view is illustrated of a silicon solar cell 20 including embedded rare earth up-conversion material 22 in accordance with the present invention. While cell 20 is explained as a silicon solar cell for convenience of understanding and because it is a preferred cell, it will be understood that silicon solar cell 20 is basically formed of semiconductor material which may be pure silicon, doped silicon or may only include silicon as one of the components. Basically, the concept is to surround up-conversion material 22 completely or substantially completely with material similar to the material forming silicon solar cell 20. Since up-conversion material 22 emits light in a lambertian profile (i.e. in all directions), when the up-conversion material is surrounded by silicon (i.e. material similar to the material forming silicon solar cell 20), all emission will eventually reach the silicon and be converted to electrical energy. Thus, the efficiency of up-conversion material 22 is substantially improved, i.e. greater than two times the transmitted light, and the overall efficiency of the solar cell is improved.

Turning now to FIGS. 4-8, several steps are illustrated in a process of embedding a rare earth up-conversion material 32 in a solar cell 30 in accordance with the present invention. In a first step a solar cell 30 is provided by any of the methods well known and understood in the art. One or more elements or components 32 of rare earth up-conversion material is epitaxially deposited or grown on a surface 34 of solar cell 30. A good up-conversion material that can be used for components 32 is $(Gd_xEr_{1-x})_2O_3$. Additional information on up-conversion and down-conversion materials can be found in a copending United States patent application entitled "Photovoltaic up conversion and down conversion using rare earths", Ser. No. 12/408,297, filed Mar. 20, 2009, (also U.S. Publication 2010/0038521) and incorporated herein by reference. As will be understood by the artisan, solar cell 30 is formed of single crystal silicon. To epitaxially grow single crystal up-conversion material on solar cell 30 the two materials must be substantially crystal lattice matched.

In some specific instances attempts to lattice match rare earth up-conversion materials with silicon is difficult because of the particular crystal orientation of the material. Silicon has a cubic crystal structure or orientation and some rare earth up-conversion materials have a hexagonal crystal structure or orientation or a different lattice spacing. Thus, it is difficult to grow some single crystal rare earth up-conversion materials on a single crystal silicon solar cell since the different crystals of the two materials may be difficult or impossible to lattice match. Here it should be understood that the term "single crystal" is used to denote crystalline silicon grown or formed as a single continuous crystal well known in the art. Information on crystal lattice matching techniques can be found in copending United States patent application entitled "High Efficiency Solar Cell Using IIIB Material Transition Layers", filed 19 Feb. 2010, with Ser. No. 12/708,969 and incorporated herein by reference.

Once single crystal rare earth components 32 are epitaxially grown on solar cell, 30 an overgrowth of material including silicon, designated 36, can be performed to completely embed components 32 in absorbing material. A back reflector 38 is then formed on the rear surface of the structure, as illustrated in FIG. 7. Back reflector 38 can be provided by a simple metallization process, for example, or by depositing any material with a sufficiently different index of refraction so that the interface substantially forms a mirror. In this fashion light that enters the device from substantially any angle (illustrated in FIG. 8) will pass through silicon and be partially absorbed and converted, while unabsorbed light will enter rare earth up-conversion components 32 where it will be up-converted so as to be absorbable by the silicon. That is reflector 38 is designed to reflect unabsorbed light <1000 nm back into solar cell 30 for a second pass (or a first pass if emitted from components 32) at absorption whilst still allowing transmission of light around the key wavelength of 1500 nm to rare earth up-conversion components 32 for up-conversion.

Turning now to FIGS. 9-12, several steps are illustrated in another process of embedding a rare earth up-conversion material 42 in a solar cell 40 in accordance with the present invention. In a first step a solar cell 40 is provided by any of the methods well known and understood in the art. Solar cell 40 is then further processed by etching a profile in the back surface including one or more depressions 44 designed to receive rare earth up-conversion material 42 deposited therein, as illustrated in FIG. 11. In the preferred embodiment rare earth up-conversion material 42 is epitaxially grown in depressions 44 using the matching technique described above. In this process, because of the formation of depressions 44 before epitaxially depositing rare earth up-conversion material 42, the rear surface can be substantially flat or planner. Thus the overgrowth of silicon can be substantially simplified.

A back reflector (not shown) is then formed on the rear surface of the structure. The back reflector can be provided by a simple metallization process, for example, or by depositing any material with a sufficiently different index of refraction so that the interface substantially forms a mirror. In this fashion light that enters the device from substantially any angle will pass through silicon and be partially absorbed and converted, while unabsorbed light will enter rare earth up-conversion components 42 where it will be up-converted so as to be absorbable by the silicon.

Figure 13:
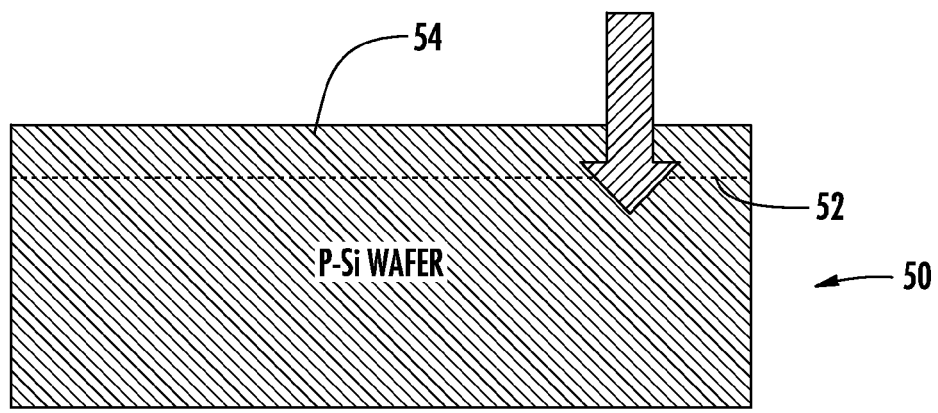
FIG. 13 is simplified view of a p-type based solar cell illustrating the location of the p-n junction.
Figure 14:
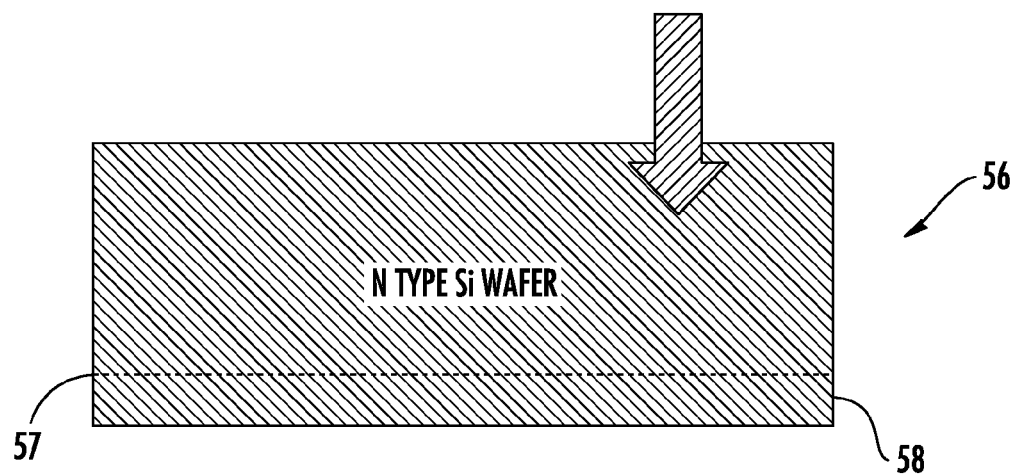
FIG. 14 is simplified view of an n-type based solar cell illustrating the location of the p-n junction.
Figure 15:
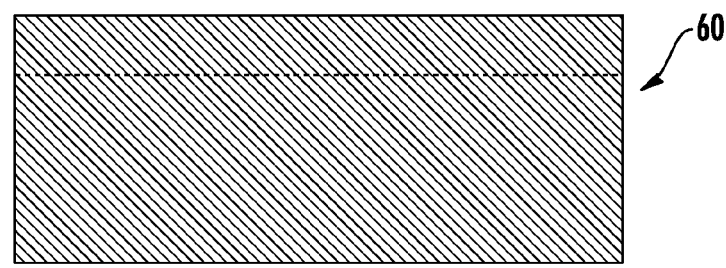
Figure 16:
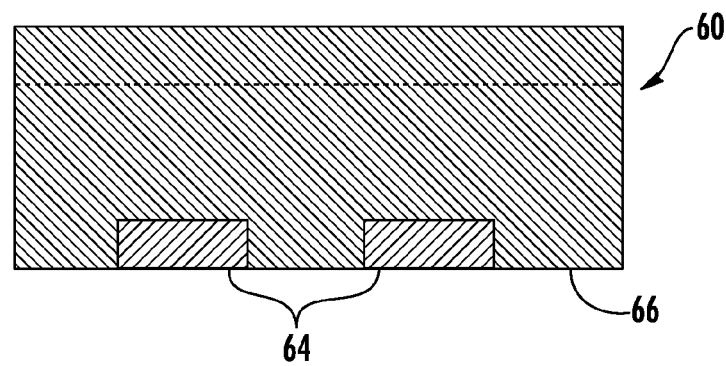

Turning to FIG. 13 the location of a p-n junction 52 in a first type of silicon solar cell 50 is illustrated. Cell 50 is formed on a P type silicon wafer by heavily doping an upper layer 54 with $N^{++}$ material to form an emitter. Similarly, a second type of silicon solar cell 56 with a p-n junction 57 is illustrated in FIG. 14. Cell 56 is formed on an N type doped silicon wafer by heavily doping a lower layer 58 with $P^{++}$ material to form an emitter. It will be noted that both of these types of silicon solar cells can be completely grown epitaxially by simply depositing the various doped materials. It is anticipated that either of these types of solar cells can be used in the presently described structures.

Turning to FIGS. 15-18, several steps are illustrated in another process of embedding a rare earth up-conversion material 64 in a solar cell 60 in accordance with the present invention. In a first step a solar cell 60 is provided on a p-type based cell with an n type diffused front emitter (see FIG. 13) by any of the methods well known and understood in the art. One or more elements or components 64 of rare earth up-conversion material is epitaxially deposited or grown on a rear surface 66 of solar cell 60 by either of the above described methods. In an embedding step shown in FIG. 17, a layer 68 of silicon is deposited over components 64 with a graded doping to enhance cell performance. As an example, the grading could range from 1e17 cm$^{-3}$ to 1e19 cm$^{-3}$. Similarly, in an embedding step shown in FIG. 18, a layer 69 of SiGe is epitaxially deposited over components 64. Layer 69 includes $Si_{1-x}Ge_x$ where the ratio can be any desired amount, for example x=0.1. Layer 69 of SiGe produces a band gap discontinuity that enhances cell performance. Basically, since the overgrown layer of silicon material including silicon is epitaxially grown, the overgrown material (e.g. layer 68 or 69) can be engineered to enhance cell performance.

Figure 19:
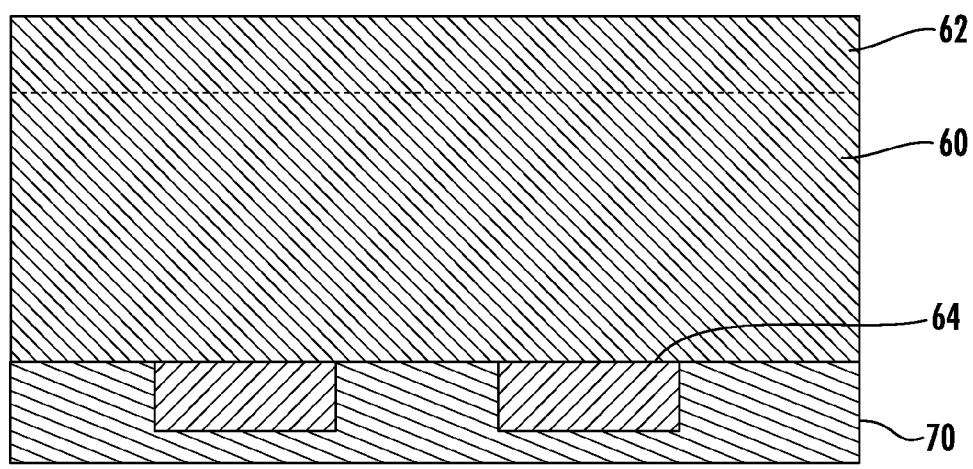
FIG. 19 is a simplified view of another embodiment of a silicon solar cell including rare earth up-conversion material in accordance with the present invention.

Referring specifically to FIG. 19, another process is illustrated of embedding rare earth up-conversion material components 64 in conjunction with solar cell 60 in accordance with the present invention. As understood by the artisan, up-conversion is the result of absorption plus emission. Rare earth materials are poor absorbers which has been an impediment to the adoption of rare earth up-conversion technology. Absorption by a rare earth material comes with two problems: there is both a low absorption cross section and a spectrally narrow absorption range. Thus, in the embedding step of this process a layer 70 of material including silicon and a blend of sensitizers is deposited over the rear surface of solar cell 60 so at to embed or surround up-conversion components 64.

Sensitizers are a material with broad absorption spectrum, e.g. from 1100 nm to 1500 nm, that can be designed to emit at 1530 nm. This emission is then absorbed by the rare earth up-conversion material (e.g. Er) and up-converted to wavelengths that can be absorbed by the silicon solar cell. Additional information about sensitizers, including examples, can be found in an article entitled "Broadband sensitizers for erbium-doped planar optical amplifiers: review" by A. Polman and F. Veggel, Vol. 21, No. 5 May 2004/*J. Opt. Soc. Am. B.*, 871-892 and an article by J. F. Suyer et al., *Optical Materials*, 27 (2005), 1111-1130.

One issue with incorporating sensitizers and up-converters together is that if the up-converted light has to travel through the sensitizer region, which has very good absorption characteristics, nothing will make it back to the solar cell. Thus, in conjunction with solar cell 60 illustrated in FIG. 19, layer 70 includes the sensitizer or sensitizers blended into the overgrown silicon containing material. Light passing through cell 60 and up-conversion material components 64 enters layer 70 and at least some will be absorbed by the sensitizer and re-emitted at, for example, 1530 nm. This re-emitted light is then up-converted by components 64 in a second pass and conveyed to solar cell 60.

Figure 21:
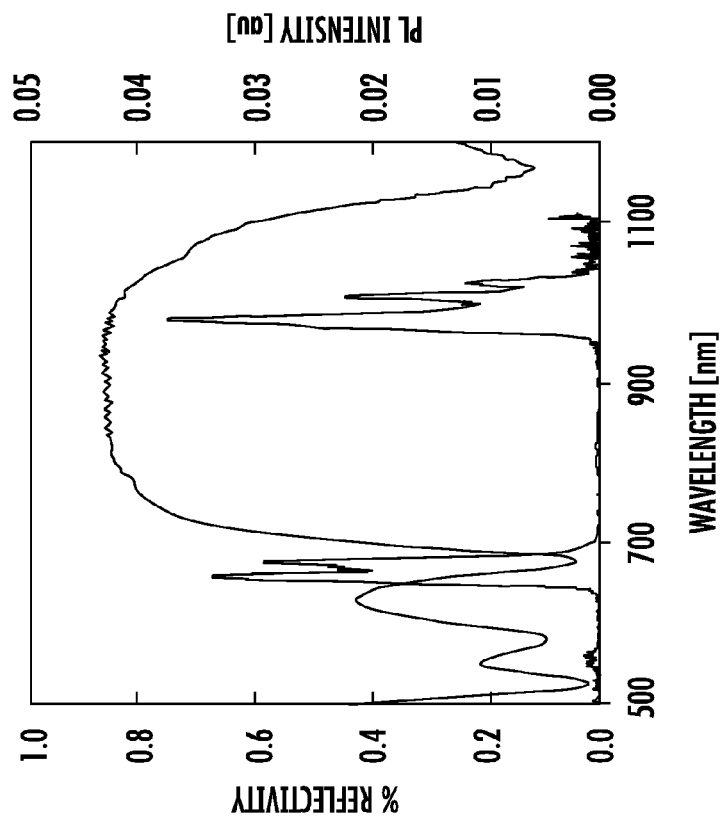
FIG. 21 is a graphical representation of the spectral conversion response of the structure of FIG. 20.
Figure 20:
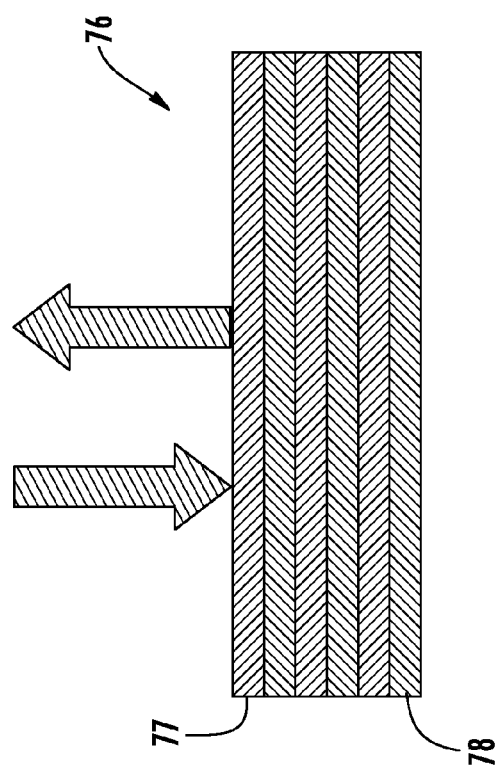
FIG. 20 illustrates one rare earth up-conversion structure which can be embedded in a solar cell in accordance with the present invention.

While all of the rare earth up-conversion elements or components described in the above structures are illustrated as a single layer of material, it should be understood that each element or component can be bulk rare earth oxide material or superlattice based rare earth oxide material. In the present structure and in a preferred embodiment, the bulk rare earth material includes a single layer of $(Gd_xEr_{1-x})_2O_3$. Turning to FIG. 20, a superlattice based rare earth up-conversion element or component 76 is illustrated. Component 76 includes a plurality of layers 77, 78 which in the preferred embodiment include alternate layers of $(Gd_xEr_{1-x})_2O_3$ and $Gd_2O_3$. Preferably, both layers 77 and 78 are designed with both reflection and transmission properties. Thus, as described initial a double pass of spectral energy occurs and energy is up-converted with each pass. A graphical representation of the reflectivity and intensity of light energy passing through component 76 is illustrated in FIG. 21.

Figure 23:
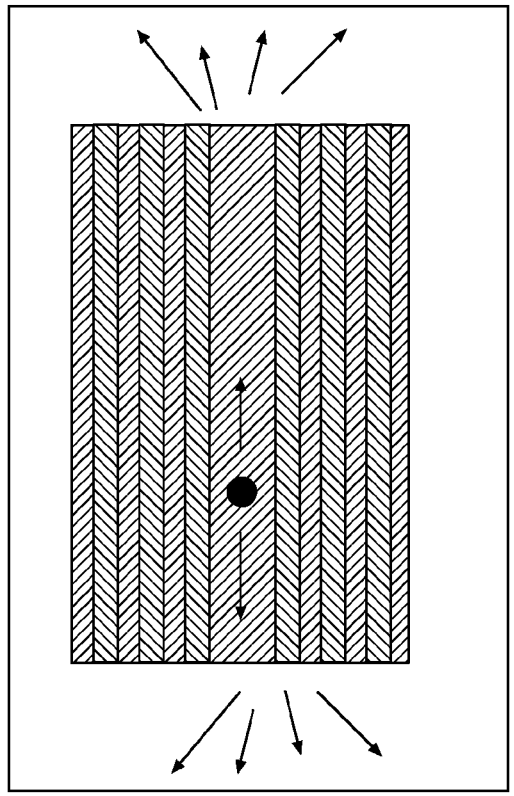
FIG. 23 illustrates the structure of FIG. 22 embedded in a solar cell in accordance with the present invention.
Figure 22:
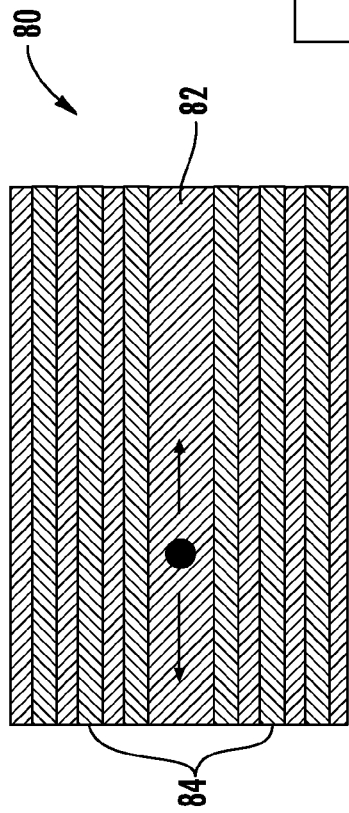
FIG. 22 illustrates another rare earth up-conversion structure which can be embedded in a solar cell in accordance with the present invention.

In a somewhat different design of a rare earth up-conversion element or component 80, illustrated in FIG. 22, a rare earth oxide structure is formed with a central high Q cavity 82 having upper and lower DBR (distributed Bragg reflector) stacks 84. By providing rare earth up-conversion element or component 80 in a solar cell the emitted photons are guided to the solar cell where they can be converted to electrical energy. Referring additionally to FIG. 23, rare earth up-conversion element or component 80 is embedded in silicon to absorb all of the emitted photons.

Figure 24:
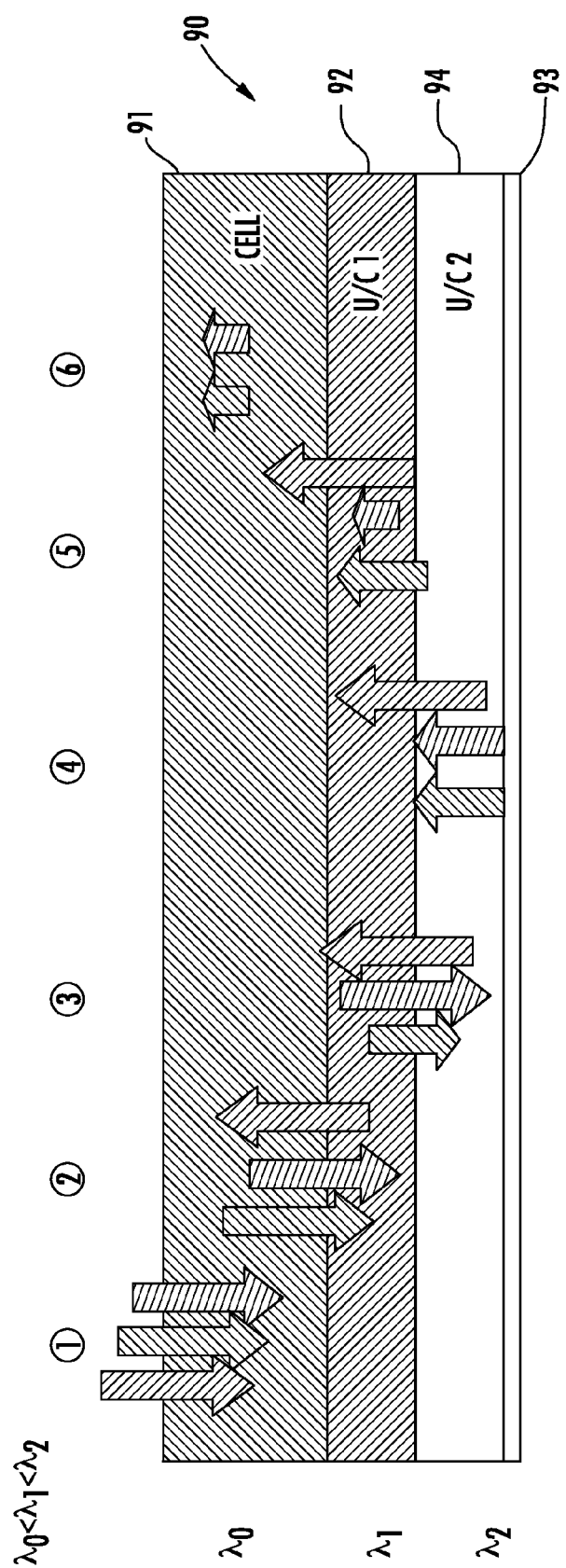
FIG. 24 illustrates a plurality of sequential steps that take place in a multi-wavelength up-conversion structure in accordance with the present invention.

Turning to FIG. 24, a plurality of sequential steps is illustrated that take place in a multi-wavelength up-conversion structure in accordance with the present invention. As an example of a multi-wavelength up-conversion structure component 90, which includes a plurality of layers 92, 94, is provided. Component 90 in the preferred embodiment includes alternate layers of $(Gd_xEr_{1-x})_2O_3$ and $Gd_2O_3$, which up-convert different wavelengths of light. Thus, for example, the basic light being emitted is $\lambda_0$, the portion of $\lambda_0$ up-converted by layers 72 is $\lambda_1$, and the portion of $\lambda_0$ up-converted by layers 74 is $\lambda_2$. A solar cell 91 and a back reflector 93 are added for purposes of explanation and a single layer 92 and 94 are illustrated for convenience of understanding.

For purposes of this explanation the input spectrum of light includes the three components $\lambda_0$, $\lambda_1$, and $\lambda_2$, illustrated as three arrows in step 1. Cell 91 absorbs all or most of $\lambda_0$, up-conversion layer 92 up-converts $\lambda_1$ to $\lambda_0$ and up-conversion layer 94 up-converts $\lambda_2$ to $\lambda_0$. In step 2, layer 92 absorbs some of $\lambda_1$ and emits some additional $\lambda_0$ back into soar cell 91. In step 3, layer 94 absorbs some of $\lambda_2$ and emits some additional $\lambda_0$ back into solar cell 91. Remaining $\lambda_1$ is unchanged. In step 4 on the second pass through up-conversion layer 94 more of $\lambda_2$ is converted to $\lambda_0$ and emitted back into solar cell 91. In step 5 on the second pass through up-conversion layer 92 more of $\lambda_1$ is converted to $\lambda_0$ and emitted back into solar cell 91. Any remaining portions of $\lambda_1$ and $\lambda_2$ are then lost to the system. Thus, each of the up-conversion elements or components described herein can be either bulk up-conversion material or a superlattice up-conversion element or component with two or more different layers of up-conversion material.

Thus, a new and improved solar cell with engineered spectral conversion elements or components is disclosed. The solar cell with engineered spectral conversion is more efficient at converting solar energy and can be engineered to absorb a broader spectrum of the incident light. Also, the new and improved solar cell with engineered spectral conversion is relatively easy and inexpensive to fabricate since completed structures can be epitaxially grown in a continuous process. Further, the present invention provides a new and improved method of fabricating solar cells with engineered spectral conversion.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A solar cell with engineered spectral conversion elements or components comprising:
   a silicon solar cell having a back surface;
   at least one spectral conversion material formed on the back surface, the at least one spectral conversion material including one of an up-conversion material and a down-conversion material, the at least one spectral conversion material singularly converting solar energy impinging thereon; and material including silicon formed on the back surface and surrounding and embedding the at least one spectral conversion material wherein the silicon solar cell is a single crystal silicon solar cell and the at least one spectral conversion material is a single crystal rare earth up-conversion material crystal lattice matched to the back surface of the silicon solar cell.

2. A solar cell with engineered spectral conversion elements or components as claimed in claim 1 wherein the at least one spectral conversion material includes a rare earth oxide.

3. A solar cell with engineered spectral conversion elements or components as claimed in claim 1 wherein the at least one spectral conversion material includes up-conversion material.

4. A solar cell with engineered spectral conversion elements or components as claimed in claim 1 further including a back reflector positioned on the material including silicon formed on the back surface so as to reflect light passing through the material including silicon formed on the back surface.

5. A solar cell with engineered spectral conversion elements or components as claimed in claim 1 wherein the at least one spectral conversion material includes one of bulk rare earth oxide material and superlattice based rare earth oxide material.

6. A solar cell with engineered spectral conversion elements or components as claimed in claim 5 wherein the at least one spectral conversion material includes superlattice based rare earth oxide material designed with both reflection and transmission properties.

7. A solar cell with engineered spectral conversion elements or components as claimed in claim 5 wherein the at least one spectral conversion material includes superlattice based rare earth oxide material designed with alternate layers of rare earth oxide material that up-convert different wavelengths of light.

8. A solar cell with engineered spectral conversion elements or components as claimed in claim 1 wherein the at least one spectral conversion material includes a high Q cavity between rare earth oxide distributed bragg reflector stacks.

9. A solar cell with engineered spectral conversion elements or components as claimed in claim 1 wherein the material including silicon further includes a sensitizer blended with the material including silicon.

10. A solar cell with engineered spectral conversion elements or components comprising:

a single crystal silicon solar cell having a back surface;

at least one spectral conversion material formed on the back surface, the at least one spectral conversion material including one of an up-conversion material and a down-conversion material, the at least one spectral conversion material including single crystal rare earth oxide, and the single crystal rare earth oxide being crystal lattice matched to the back surface of the single crystal silicon solar cell;

material including silicon formed on the back surface and surrounding and embedding the at least one spectral conversion material; and a back reflector positioned on the material including silicon formed on the back surface so as to reflect light passing through the material including silicon formed on the back surface.

11. A solar cell with engineered spectral conversion elements or components as claimed in claim 10 wherein the at least one spectral conversion material includes up-conversion material.

12. A solar cell with engineered spectral conversion elements or components as claimed in claim 10 wherein the at least one spectral conversion material includes one of bulk rare earth oxide material and superlattice based rare earth oxide material.

13. A solar cell with engineered spectral conversion elements or components as claimed in claim 12 wherein the at least one spectral conversion material includes superlattice based rare earth oxide material designed with both reflection and transmission properties.

14. A solar cell with engineered spectral conversion elements or components as claimed in claim 12 wherein the at least one spectral conversion material includes superlattice based rare earth oxide material designed with alternate layers of rare earth oxide material that up-convert different wavelengths of light.

15. A solar cell with engineered spectral conversion elements or components as claimed in claim 10 wherein the material including silicon further includes a sensitizer blended with the material including silicon.

* * * * *